United States Patent
Jeon et al.

(10) Patent No.: US 9,758,622 B2
(45) Date of Patent: Sep. 12, 2017

(54) PHOTOALIGNMENT LAYER AND LIQUID CRYSTAL DISPLAY

(71) Applicant: Samsung Display Co., Ltd., Yongin (KR)

(72) Inventors: Jong Hwan Jeon, Gwangju-si (KR); Suk Hoon Kang, Seoul (KR); Jin-Soo Jung, Hwaseong-si (KR); In Ok Kim, Osan-si (KR); Jun Woo Lee, Seongnam-si (KR); Baek Kyun Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 89 days.

(21) Appl. No.: 14/832,640

(22) Filed: Aug. 21, 2015

(65) Prior Publication Data

US 2016/0229958 A1    Aug. 11, 2016

(30) Foreign Application Priority Data

Feb. 9, 2015    (KR) .................. 10-2015-0019565

(51) Int. Cl.
  *C09K 19/00*   (2006.01)
  *C08G 73/10*   (2006.01)
  (Continued)

(52) U.S. Cl.
  CPC ............ *C08G 73/101* (2013.01); *B32B 23/08* (2013.01); *C08G 73/1042* (2013.01);
  (Continued)

(58) Field of Classification Search
  CPC .. C08G 73/101; C08G 73/10; C08G 73/1007; C08G 73/1046; C08G 73/1064;
  (Continued)

(56) References Cited

U.S. PATENT DOCUMENTS 6,063,829 A    5/2000    Endou et al.
7,615,260 B2   11/2009   Yoneya et al.
(Continued)

FOREIGN PATENT DOCUMENTS

JP    2008-116809    5/2008
JP    2012-093642    5/2012
(Continued)

OTHER PUBLICATIONS

Seckin et al., Molecular desing of POSS core star polyimide, Jul. 2008, Mater. Chem. & Phys., 112, p. 1040-1046.*
(Continued)

*Primary Examiner* — Ruiyun Zhang
(74) *Attorney, Agent, or Firm* — H.C. Park & Associates, PLC

(57) ABSTRACT

A photoalignment agent includes a polyimide and a capping terminal connected to a main chain end terminal of the polyimide. The capping terminal includes an alkylene group (—$C_mH_{2m}$—, m is a natural number) and a core stereo unit in a dendrimer format. A liquid crystal display includes a first substrate, a thin film transistor disposed on the first substrate, a first electrode connected to the thin film transistor, and a first alignment layer disposed on the first electrode. The first alignment layer includes a polyimide and a capping terminal connected to a main chain end terminal of the polyimide. The capping terminal includes an alkylene group (—CmH2m-, m is a natural number) and a core stereo unit in a dendrimer format.

23 Claims, 9 Drawing Sheets

(51) Int. Cl.
  G02F 1/1337    (2006.01)
  C09K 19/56     (2006.01)
  G02F 1/1333    (2006.01)
  G02F 1/1343    (2006.01)
  G02F 1/1362    (2006.01)
  G02F 1/1368    (2006.01)
  H01L 27/12     (2006.01)
  B32B 23/08     (2006.01)
  C09D 179/08    (2006.01)

(52) U.S. Cl.
  CPC ....... *C08G 73/1078* (2013.01); *C09D 179/08* (2013.01); *C09K 19/56* (2013.01); *G02F 1/1368* (2013.01); *G02F 1/13439* (2013.01); *G02F 1/133345* (2013.01); *G02F 1/133711* (2013.01); *G02F 1/133723* (2013.01); *G02F 1/134309* (2013.01); *G02F 1/136227* (2013.01); *H01L 27/1248* (2013.01); *Y10T 428/1023* (2015.01)

(58) Field of Classification Search
  CPC .............. C09K 19/56; G02F 1/133723; G02F 1/13378; G02F 1/133788; G02F 1/133711; G02F 1/134309; G02F 1/136227; Y10T 428/10; Y10T 428/1005; Y10T 428/1018; Y10T 428/1023

USPC ........ 428/1.1, 1.2, 1.25, 1.26; 349/123, 130, 349/132; 525/426; 524/600, 602; 528/322, 310, 353, 350
  See application file for complete search history.

(56) References Cited

U.S. PATENT DOCUMENTS

| | | |
|---|---|---|
| 2006/0193040 A1 | 8/2006 | Kim et al. |
| 2006/0204680 A1 | 9/2006 | Hattori et al. |
| 2012/0196054 A1* | 8/2012 | Lee .................. G02F 1/133788 428/1.26 |

FOREIGN PATENT DOCUMENTS

| | | |
|---|---|---|
| KR | 10-2005-0078720 | 8/2005 |
| KR | 10-2006-0088973 | 8/2006 |
| KR | 10-2010-0085068 | 7/2010 |
| WO | 2008/053848 | 5/2008 |

OTHER PUBLICATIONS

Extended European Search Report dated Apr. 4, 2016 corresponding to European Application No. 15187017.7.

* cited by examiner

PHOTOALIGNMENT LAYER AND LIQUID CRYSTAL DISPLAY

CROSS-REFERENCE TO RELATED APPLICATION

This application claims priority from and the benefit of Korean Patent Application No. 10-2015-0019565, filed on Feb. 9, 2015, which is hereby incorporated by reference for all purposes as if fully set forth herein.

BACKGROUND

Field

Exemplary embodiments relate to a photoalignment layer and a liquid crystal display.

Discussion of the Background

In order for a liquid crystal element to implement an image (i.e., when a liquid crystal is switched between transparent conductive glasses by an external electric field), the liquid crystal should be aligned in a certain direction in the interphase between the liquid crystal and the transparent conductive glass electrode. A uniformity degree of liquid crystal alignment is the most important factor in determining superiority of image quality of a liquid crystal display.

A general method of aligning a liquid crystal includes a rubbing method wherein a polymer film (e.g., a polyimide) is applied on a surface of a substrate (e.g., a glass substrate), and the polymer film applied on the substrate's surface is rubbed in a certain direction with a fiber (e.g., nylon or polyester). However, the rubbing method may generate fine dust or static electricity when fiber and polymer film are fractionized. The fractionized fiber and polymer film may cause a serious problem when manufacturing a liquid crystal panel.

Recently, researchers have discovered a photoalignment method where liquid crystals are aligned using anisotropy to induce a polymer film by light irradiation.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a photoalignment layer and a liquid crystal display having an advantage of optimizing afterimage and film strength.

Additional aspects will be set forth in the detailed description which follows, and, in part, will be apparent from the disclosure, or may be learned by practice of the inventive concept.

An exemplary embodiment discloses a photoalignment layer, including a polyimide and a capping terminal connected to a main chain terminal of the polyimide. The capping terminal includes an alkylene group ($-C_mH_{2m}-$, m is a natural number) and a core stereo unit in a dendrimer format.

An exemplary embodiment discloses a liquid crystal display including a first substrate, a thin film transistor disposed on the first substrate, a first electrode connected to the thin film transistor, and a first alignment layer disposed on the first electrode. The first alignment layer includes a polyimide and a capping terminal connected to a main chain terminal of the polyimide. The capping terminal includes an alkylene group ($(-C_mH_{2m}-$, m is a natural number) and a core stereo unit in a dendrimer format.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
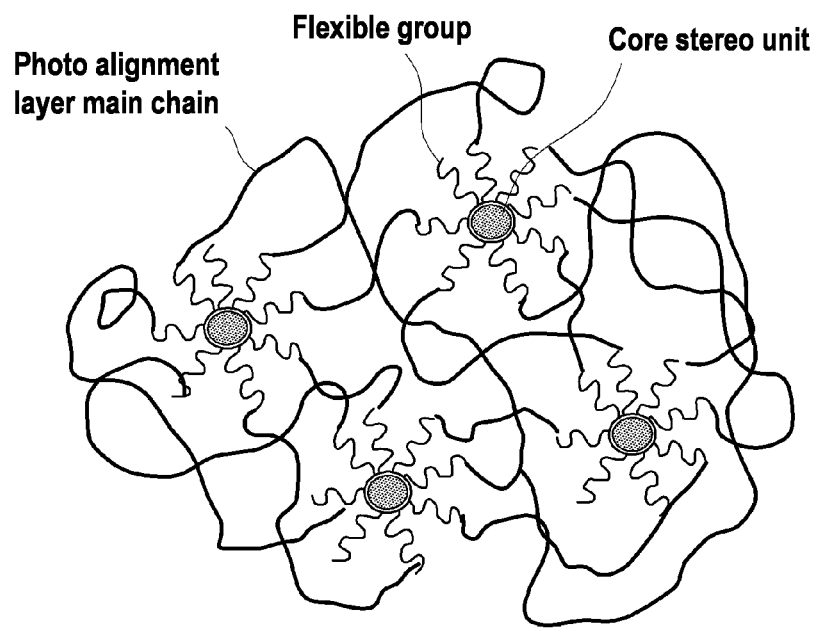
FIG. 1 illustrates a capping terminal included in a photoalignment layer according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A photoalignment agent according to an exemplary embodiment includes at least one of a polyimide and a polyamic acid, and a capping terminal connected to a main chain terminal of at least one of the polyimide and the polyamic acid, wherein the capping terminal includes a flexible group including an alkylene group (($-C_mH_{2m}-$, m is a natural number) and a core stereo unit in a dendrimer format.

The capping terminal is a stereo compound expressed as $(Z-SiO_{3/2})_n$ (n is an even number that is greater than 6), and Z may include at least one of a first compound expressed in Chemical Formula 1 and a second compound expressed in Chemical Formula 2.

Chemical Formula 1

Chemical Formula 2

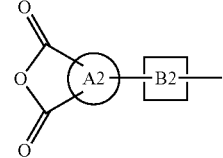

Here, A1 and A2 are, independently, a C4 to C20 aromatic compound or a C4 to C20 aliphatic cyclic compound. B1 and B2 are, independently, flexible groups including an alkylene group (($-C_mH_{2m}-$, m is a natural number).

The capping terminal may also include a compound expressed in Chemical Formulas A, B, C, and D. Here, the dendrimer-shaped core stereo unit may be a portion excluding the Z group. A plurality of Z groups may be connected to one core stereo unit.

(Chemical Formula A)

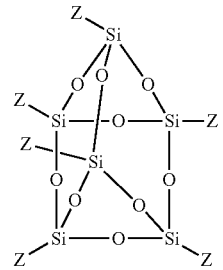

(Chemical Formula B)

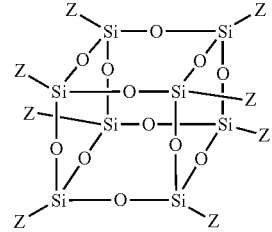

-continued

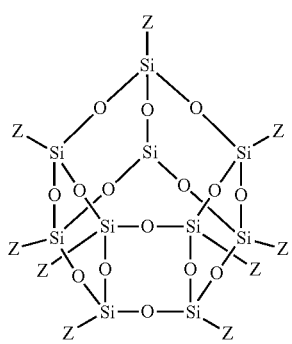
(Chemical Formula C)

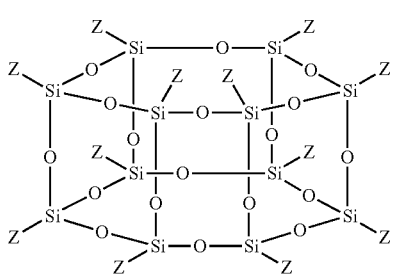
(Chemical Formula D)

The flexible group may include a third compound expressed in Chemical Formula 3.

—X1-Y—X2-     (Chemical Formula 3)

Here, X1 and X2 are, independently, a single bond, —O—, —S—, —COO—, —OCO—, —NHCO—, —NH—, —CH$_2$CH$_2$O—, —OCH$_2$CH$_2$—, a C6 to C30 aromatic compound, or a C4 to C20 aliphatic cyclic compound, Y is a single bond, —(CH$_2$)$_{a1}$— (a1 is a natural number of 2 to 10), —(CH$_2$OCH$_2$)$_{a2}$— (a2 is a natural number of 1 to 3), —(CH$_2$CH$_2$OCH$_2$CH$_2$)$_{a3}$— (a3 is 1 or 2), or —(OSi(OR)$_2$)$_{a4}$— (R is C$_n$H$_{2n+1}$, n is a natural number of 1 to 10, and a4 is a natural number of 2 to 8). Herein, the aromatic compound may be, though not particularly limited to, phenyl, alkyl-substituted phenyl, fluorine-substituted phenyl, biphenyl, naphthalene, anthracene, or pentacene, and the aliphatic cyclic compound may be, though not particularly limited to, cyclohexane, cyclobutane, or cyclopentane.

The flexible group may include a compound expressed in Chemical Formula 3-1.

(Chemical Formula 3-1)

Here, n is a natural number of 3 to 11, and X9 is a single bond, —(CH$_2$)$_m$—O—, —O—(CH$_2$)$_m$—, —(CH$_2$)$_m$—S—, —S—(CH$_2$)$_m$— (m is a natural number of 1 to 10),

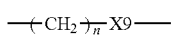

a C6 to C30 aromatic compound, or a C4 to C20 aliphatic cyclic compound.

As described, the capping terminal includes an alkylene group (—CH$_2$—) corresponding to the flexible group. The alkylene group is connected to the photoalignment layer main chain so the photoalignment layer formed by using the photoalignment agent including the capping terminal improves film hardness and minimizes deterioration by afterimages.

The polyamic acid may include a repeating unit of a fourth compound expressed in Chemical Formula 4. The polyimide may include a repeating unit of a fifth compound expressed in Chemical Formula 5.

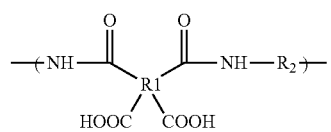
(Chemical Formula 4)

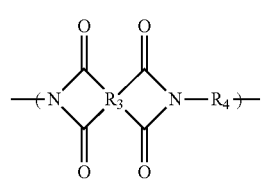
(Chemical Formula 5)

Here, R1 and R3 are, independently, a tetravalent organic group derived from an aliphatic cyclic acid dianhydride or an aromatic acid dianhydride, and R2 and R4 are, independently, a divalent organic group derived from aromatic diamine.

The polyimide or the polyamic acid may include a copolymer of (a) at least one of a cyclobutane dianhydride (CBDA) and a cyclobutane dianhydride (CBDA) derivative, and (b) a first diamine.

The cyclobutane dianhydride (CBDA) and the cyclobutane dianhydride (CBDA) derivative may include a compound expressed in Chemical Formula 8.

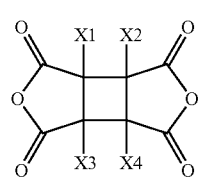
(Chemical Formula 8)

Here, X1, X2, X3, and X4 are, independently, hydrogen, a halogen, a substituted or unsubstituted alkyl group, a substituted or unsubstituted aryl group, or a substituted or unsubstituted heteroaryl group. Herein, if X1 to X4 are hydrogen, the compound may be a cyclobutane dianhydride.

In Chemical Formula 8, the cyclobutane dianhydride may contain a compound represented by Chemical Formula 8-1, and the cyclobutane dianhydride derivative may contain a compound represented by Chemical Formulas 8-2 and 8-3.

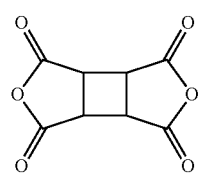
(Chemical Formula 8-1)

-continued

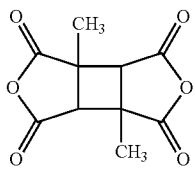
(Chemical Formula 8-2)

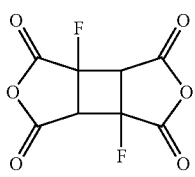
(Chemical Formula 8-3)

The first diamine may include an alkylene group ($-C_kH_{2k}-$, k is a natural number). The first diamine may be a sixth compound expressed in (Chemical Formula 6).

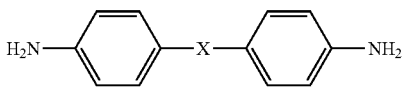
(Chemical Formula 6)

Herein, X is

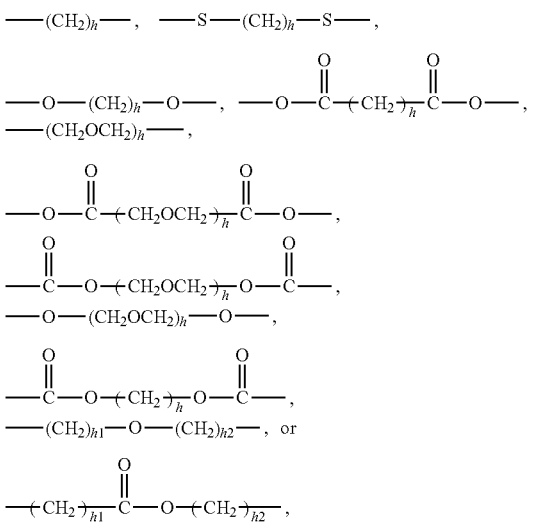

h is a natural number of 1 to 10, and h1 and h2 are, independently of each other, a natural number selected so that the sum of number of carbons of an alkylene group of X is 2 to 10.

The photoalignment agent according to the present exemplary embodiment may further include a second diamine expressed in Chemical Formula 7.

(Chemical Formula 7)

The second diamine is not limited to the compound represented by Chemical Formula 7, and may be a compound of Chemical Formula 7 wherein a hydrogen connected to a carbon ring is substituted with an alkyl group, a halogen, sulfur, and the like. The second diamine may be an aromatic diamine such as p-phenylenediamine, m-phenylenediamine, 2,5-diaminotoluene, 2,6-diaminotoluene, 4,4'-diaminobiphenyl, 3,3'-dimethyl-4,4'-diaminobiphenyl, 3,3'-dimethoxy-4,4'-diaminobiphenyl, diaminodiphenylmethane, diaminodiphenylether, 2,2'-diaminodiphenylpropane, bis(3,5-diethyl4-aminophenyl)methane, diaminodiphenylsulfone, diaminobenzophenone, diaminonaphthalene, 1,4-bis(4-aminophenoxy)benzene, 1,4-bis(4-aminophenyl)benzene, 9,10-bis(4-aminophenyl)anthracene, 1,3-bis(4-aminophenoxy)benzene, 4,4'-bis(4-aminophenoxy)diphenylsulfone, 2,2-bis[4-(4-aminophenoxy)phenyl]propane, 2,2-bis(4-aminophenyl)hexafluoropropane, 2,2-bis[4-(4-aminophenoxy)phenyl]hexafluoropropane, and the like, an alicyclic diamine such as bis(4-aminocyclohexyl)methane, bis(4-amino-3-methylcyclohexyl)methane, and the like. The second diamine may be an aliphatic diamine such as tetramethylenediamine, hexamethylenediamine, and the like. However, the second diamine is not particularly limited thereto, and may include any diamine, other than the first diamine, having an unflexural property.

In an embodiment, the mole ratio between the first diamine and the second diamine may be 1:99 to 99:1, preferably approximately 20:80 to 50:50.

According to an embodiment, the photoalignment layer is formed by using the photoalignment agent including a copolymer of the first diamine containing an alkylene group ($-CH_2-$). The alkylene group is a flexible group that provides the photoalignment agent with a flexible property. A liquid crystal display including the flexible photoalignment agent has improved anisotropy and less afterimages than a liquid crystal display without the flexible photoalignment agent.

A method for manufacturing a photoalignment agent according to an embodiment will now be described.

0.5 mol of a compound represented by Chemical Formula 6 and N-methyl-2-pyrrolidone (NMP) was placed in a four-neck flask under inert conditions (e.g., while passing nitrogen through the four-neck flask) to prepare a mixed solution. The four-neck flask was equipped with a stirrer, a temperature controller, a nitrogen gas injector, and a condenser in a dark room. 0.95 mol of a solid state compound represented by Chemical Formula 8 was placed in the four-neck flask with the compound represented by Chemical Formula 6 and N-methyl-2-pyrrolidone (NMP), and stirred for about 1 hour. Next, 0.5 mol of a compound represented by Chemical Formula 7 was injected into the four-neck flask to be reacted. At this time, the reaction was carried out for about 24 hours at a temperature of 30 to 60° C., thereby preparing a polyamic acid solution. The polyamic acid solution was distilled to obtain a polyamic acid having an average molecular weight of 3 to 50,000. A mixed solvent of N-methyl-2-pyrrolidone (NMP) and 2-butyl cellosolve (volume ratio=about 7:2) was added to the polyamic acid, and stirred at room temperature for 24 hours. About 5 to 7 wt % of a capping terminal represented by Chemical Formula B was added to the polyamic acid and the mixed solvent of N-methyl-2-pyrrolidone (NMP) and 2-butyl cellosolve (volume ratio=about 7:2) to prepare a photoalignment agent having a Z group of the capping terminal connected to a main chain terminal of a polyamic acid.

When the ratio of the diamine to the acid anhydride is greater than 1 as described in the present experimental example, the terminal of the polyamic acid main chain may be a diamine. Thus, it is desirable to add the capping terminal including the Z group in the acid dianhydride form expressed in Chemical Formula 2.

Chemical Formula 8 is repeated for ease of reference.

(Chemical Formula 8)

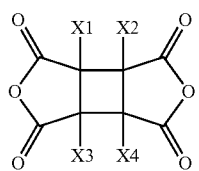

In an embodiment of Chemical Formula 8, X1 and X4 are a methyl group, and X2 and X3 are hydrogen.

Chemical Formula 2 is repeated for ease of reference.

(Chemical Formula 2)

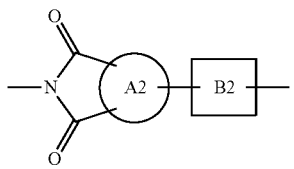

In Chemical Formula 2, A2 is a C4 to C20 aromatic compound or a C4 to C20 aliphatic cyclic compound, and B2 is a flexible group including an alkylene group ($-C_nH_{2n}-$, n is a natural number).

Chemical Formulas 6 and 7 are repeated for ease of reference.

(Chemical Formula 6)

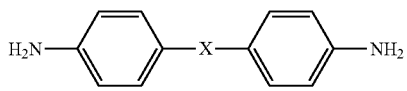

(Chemical Formula 7)

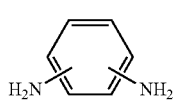

In an embodiment, when reacting 1 mol of acid dianhydride (which is the compound represented by Chemical Formula 8) and 0.95 mol of the compound represented by Chemical Formulas 6 and 7 corresponding to diamine, the group having the main chain terminal derived from the acid dianhydride is increased. In other words, it is desirable to add the capping terminal including a Z group that is similar to the diamine expressed in Chemical Formula 1 when the ratio of diamine to acid anhydride is less than 1.

A method for manufacturing a photoalignment layer with the above-described photoalignment agent will not be described.

The above-described photoalignment agent is applied to the electrode and then baked. The baking process may include a pre-bake and a hard bake.

The photoalignment layer may be formed by irradiating polarized beams to the photoalignment agent. The ultraviolet rays within the range of 240 nanometers to 380 nanometers may be used for the irradiated beams. Desirably, ultraviolet rays of 254 nanometers are usable. The polarized beams may include energy of 0.20 J/cm² to 1.0 J/cm², or more desirably 0.40 J/cm² to 0.50 J/cm².

To increase alignment, the photoalignment layer may be baked a second time (hereinafter "a second baking process").

A polyimide included in the photoalignment layer may include a repeating unit of a fifth compound expressed in Chemical Formula 5.

(Chemical Formula 5)

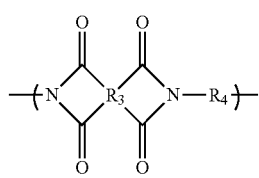

Here, R3 is a tetravalent organic group derived from an aliphatic cyclic acid dianhydride or an aromatic acid dianhydride, and R4 is a divalent organic group derived from the aromatic diamine.

The photoalignment layer includes a polyimide and a capping terminal connected to the main chain terminal of the polyimide.

The Z group of the capping terminal connected to the main chain terminal of the polyimide may be expressed in Structural Formulas 1 or 2.

(Structural Formula 1)

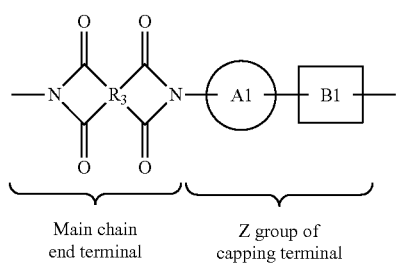

Main chain end terminal / Z group of capping terminal (Structural Formula 2)

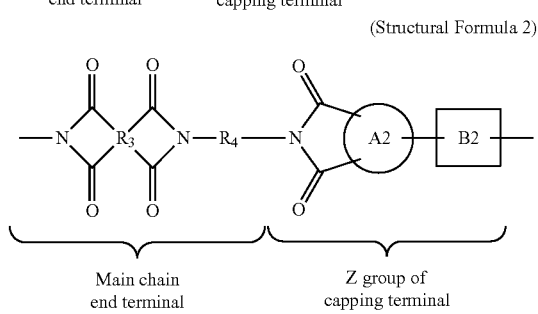

Main chain end terminal / Z group of capping terminal

In Structural Formulas 1 and 2, R3 is a tetravalent organic group derived from an aliphatic cyclic acid dianhydride or an aromatic acid dianhydride, R4 is a divalent organic group derived from the aromatic diamine, A1 and A2, independently of each other, are a C4 to C20 aromatic compound or a C4 to C20 aliphatic cyclic compound, and B1 and B2, independently of each other, are a flexible group including an alkylene group ($-C_nH_{2n}-$, n is a natural number).

The copolymer corresponding to the main chain in the photoalignment layer according to an exemplary embodiment of the present invention may contain at least one of repeating units represented by Chemical Formulas 9 and 10.

(Chemical Formula 9)

![Chemical Formula 9 structure]

(Chemical Formula 10)

![Chemical Formula 10 structure]

Here, X (not X1 to X8) is —$(CH_2)_h$—, —S—$(CH_2)_h$—S—, —O—$(CH_2)_h$—O—, $$—O—\overset{O}{\overset{\|}{C}}—(CH_2)_h—\overset{O}{\overset{\|}{C}}—O—, \quad —(CH_2OCH_2)_h—,$$

$$—O—\overset{O}{\overset{\|}{C}}—(CH_2OCH_2)_h—\overset{O}{\overset{\|}{C}}—O—,$$

$$—\overset{O}{\overset{\|}{C}}—O—(CH_2OCH_2)_h—O—\overset{O}{\overset{\|}{C}}—,$$

$$—O—(CH_2OCH_2)_h—O—,$$

$$—\overset{O}{\overset{\|}{C}}—O—(CH_2)_h—O—\overset{O}{\overset{\|}{C}}—,$$

$$—(CH_2)_{h1}—O—(CH_2)_{h2}—, \text{ or}$$

$$—(CH_2)_{h1}—\overset{O}{\overset{\|}{C}}—O—(CH_2)_{h2}—,$$

h is a natural number of 1 to 10, h1 and h2 are natural numbers that are selected so that the sum of carbon numbers of the alkylene group of X may be 2 to 10, and X1 to X8 are hydrogen, a halogen, a substituted or unsubstituted alkyl group, a substituted or unsubstituted aryl group, or a substituted or unsubstituted heteroaryl group, respectively.

Preferably, the photoalignment layer may include a copolymer expressed in Chemical Formula 11.

Here, X (not X1 to X8) is —$(CH_2)_h$—, —S—$(CH_2)_h$—S—, —O—$(CH_2)_h$—O—, $$—O—\overset{O}{\overset{\|}{C}}—(CH_2)_h—\overset{O}{\overset{\|}{C}}—O—, \quad —(CH_2OCH_2)_h—,$$

$$—O—\overset{O}{\overset{\|}{C}}—(CH_2OCH_2)_h—\overset{O}{\overset{\|}{C}}—O—,$$

$$—\overset{O}{\overset{\|}{C}}—O—(CH_2OCH_2)_h—O—\overset{O}{\overset{\|}{C}}—,$$

$$—O—(CH_2OCH_2)_h—O—,$$

$$—\overset{O}{\overset{\|}{C}}—O—(CH_2)_h—O—\overset{O}{\overset{\|}{C}}—,$$

$$—(CH_2)_{h1}—O—(CH_2)_{h2}—, \text{ or}$$

$$—(CH_2)_{h1}—\overset{O}{\overset{\|}{C}}—O—(CH_2)_{h2}—,$$

h is a natural number of 1 to 10, h1 and h2 are natural numbers selected so that the sum of carbon numbers of the alkylene group of X may be 2 to 10, a:b is 20:80 to 50:50, and X1 to X8 are hydrogen, a halogen, a substituted or unsubstituted alkyl group, a substituted or unsubstituted aryl group, or a substituted or unsubstituted heteroaryl group, respectively.

FIG. 1 shows a capping terminal included in a photoalignment layer according to an exemplary embodiment.

The capping terminal may be connected to the photoalignment layer main chain terminal through the Z group of the capping terminal as expressed in Structural Formulas 1-1 or 2-1.

(Structural Formula 1-1)

![Structural Formula 1-1 with Main chain end terminal and Z group of capping terminal labeled, containing B1]

(Chemical Formula 11)

![Chemical Formula 11 copolymer structure with subscripts a and b]

-continued (Structural Formula 2-1)

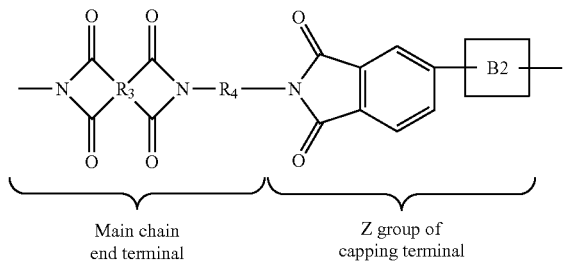

Main chain end terminal | Z group of capping terminal

In Structural Formulas 1-1 and 2-1, R3 is a tetravalent organic group derived from an aliphatic cyclic acid dianhydride or an aromatic acid dianhydride, R4 is a divalent organic group derived from an aromatic diamine, and B1 and B2, independently of each other, are a flexible group including an alkylene group ($-C_nH_{2n}-$, n is a natural number).

Referring to FIG. 1, a plurality of Z groups may be connected to the core stereo unit and may be connected to a terminal of the photoalignment layer main chain. Here, the photoalignment layer main chain may be formed by copolymerization of a diamine and an acid dianhydride. For example, a copolymer of at least one of cyclobutane dianhydride (CBDA) and a cyclobutane dianhydride (CBDA) derivative, and a diamine may be a main chain of the photoalignment layer.

Figure 2:
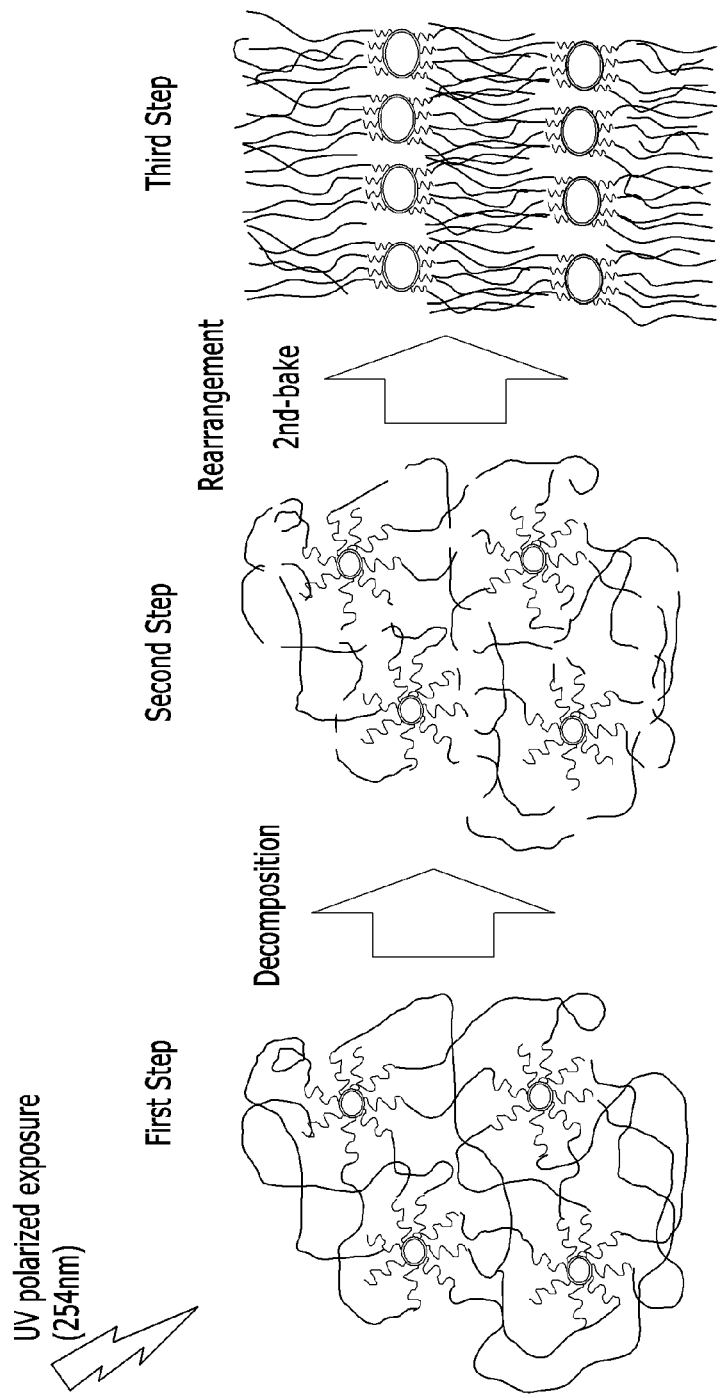
FIG. 2 illustrates a process for arranging an alignment material on a photoalignment layer according to an exemplary embodiment.

FIG. 2 shows a process for arranging an alignment material on a photoalignment layer according to an exemplary embodiment.

Referring to FIG. 2, a photolysis occurs when polarized ultraviolet rays of 254 nanometers are irradiated to the photoalignment agent having undergone pre-baking and hard baking (First Step). The photoalignment agent decomposes due to the exposure to the ultraviolet rays (Second Step). Finally, the photoalignment agent may be rearranged by performing a second baking process (Third Step). The alignment of the photoalignment layer according to the present exemplary embodiment may be increased by performing the second baking process.

Figure 3:
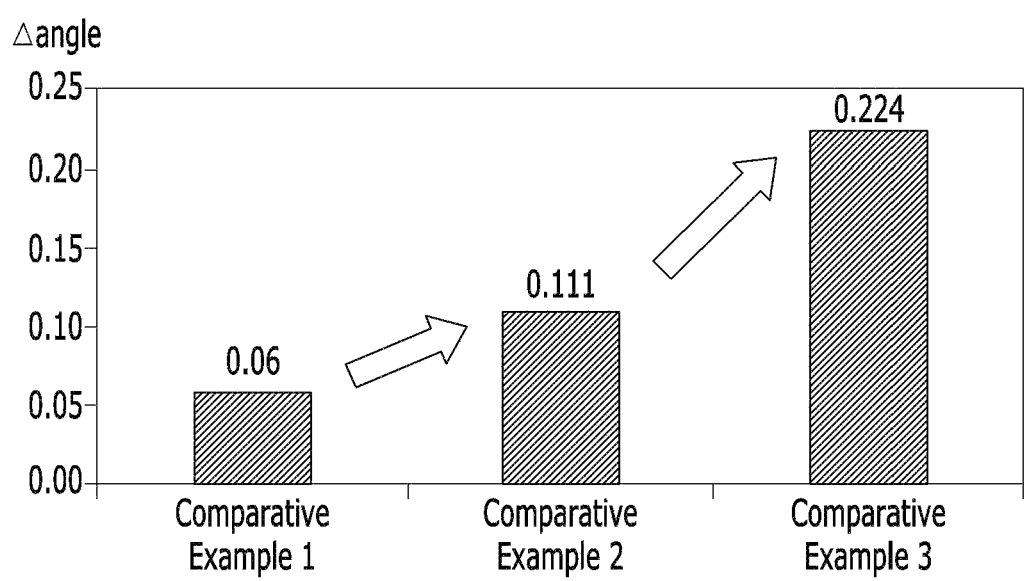
FIG. 3 is a graph comparing afterimages of liquid crystal displays using photoalignment layers with varying amounts of a rigid cross-linking agent.

FIG. 3 is a graph comparing afterimages of liquid crystal displays using photoalignment layers with varying amounts of a rigid crosslinking agent. Specifically, the graph illustrates a difference (Δ angle) between a current angle of liquid crystal molecules and the angle of the original position of liquid crystal molecules (i.e., the measurement of liquid crystals failure to return to their original position). More specifically, voltage is turned on to the liquid crystal display when liquid crystal molecules are aligned. Afterwards, the voltage supply is turned off and the liquid crystal molecules are supposed to return to their original position. The difference between the liquid crystals' original position and their current position is Δ angle, which is an indicator of afterimage. For example, if Δ angle is large, then the corresponding liquid crystal display has a large after image.

Referring to FIG. 3, Comparative Example 1 is an example of a liquid crystal display having photoalignment layer that does not include a rigid crosslinking agent, but does include a photoalignment agent with a copolymer of a flexible diamine according to an exemplary embodiment. Comparative Example 2 is an example of a liquid crystal display having a photoalignment layer including 3 wt % of a rigid crosslinking agent represented by Chemical Formula 12 (below) and a photoalignment agent including a copolymer of a flexible diamine. Comparative Example 3 is an example of a liquid crystal display photoalignment layer including 5 wt % of a rigid crosslinking agent represented by Formula 12 and a photoalignment agent including a copolymer of a flexible diamine. Regarding Comparative Examples 1 to 3, the first baking proceeds at 210° C. for 30 minutes, and polarized beams at 0.5 J/cm² are irradiated. Then, the second baking proceeds at 210° C. for 30 minutes.

(Chemical Formula 12)

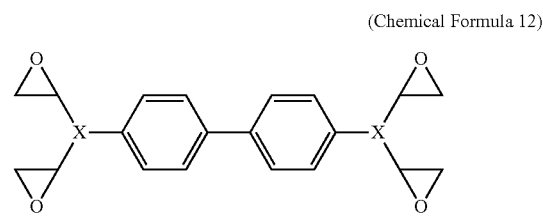

In Chemical Formula 12, X may be

Referring to FIG. 3, liquid crystal displays with larger amounts of the rigid crosslinking agent have worse the afterimages (i.e., larger Δ angle). Therefore, the rigid crosslinking agent is inappropriate for a crosslinking agent for improving film hardness in a photo-alignment layer formed by using flexible diamine.

Figure 4:
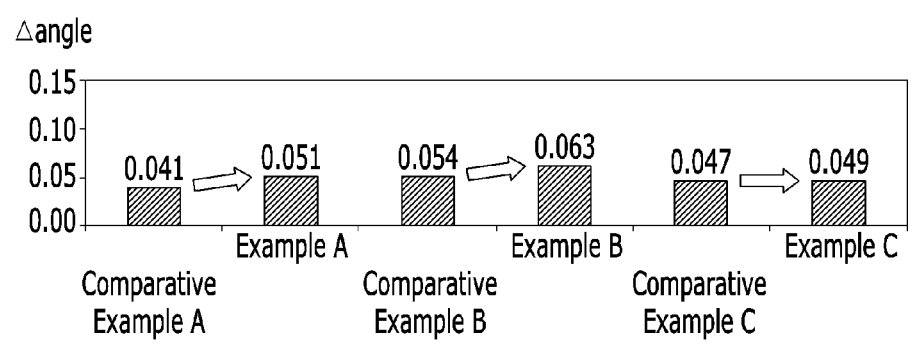
FIG. 4 is a graph comparing afterimages of liquid crystal displays using photoalignment layers with and without flexible capping groups.

FIG. 4 is a graph comparing afterimages of liquid crystal displays using photoalignment layers with and without flexible capping groups.

Regarding FIG. 4, Comparative Examples A, B, and C are example liquid crystal displays having photoalignment layers without capping groups. Exemplary Embodiments A, B and C are example liquid crystal displays having photoalignment layers including a 3 wt % of the capping terminal having a flexible group. In Comparative Example A and Exemplary Embodiment A, the photoalignment agent is first baked at 230° C. for about 900 seconds, then irradiated by polarized beams at 0.5 J/cm², and finally baked for a second time the at 210° C. for about 900 seconds. Similarly, in Comparative Example B and Exemplary Embodiment B, the photoalignment agent is first baked at 230° C. for about 900 seconds and then irradiated by polarized beams at 0.5 J/cm² are irradiated. However, unlike Comparative Example A and Exemplary Embodiment A, the photoalignment agent of Comparative Example B and Exemplary Embodiment B is baked for at second time at 230° C. for about 900 seconds. Unlike the previous processes, in Comparative Example C and Exemplary Embodiment C, the photoalignment layer is first baked at 240° C. for about 900 seconds. But similar to Comparative Example A and Exemplary Embodiment A, photoalignment layer is irradiated by polarized beams at 0.5 J/cm² and baked for a second time at 210° C. for about 900 seconds.

Referring to FIG. 4, the exemplary embodiments including the flexible group in the capping terminal have negligible afterimage deterioration when compared to their corresponding comparative example. For example, Comparative Example C has an afterimage deterioration of 0.047° (Δ angle), while Exemplary Embodiment C has an afterimage deterioration of 0.049° Δ angle). When compared to Comparative Examples 2 and 3 of FIG. 3, Exemplary Embodiments A, B, and C have an even more impressive afterimage deterioration (i.e., Exemplary Embodiments A, B, and C have Δ angles of 0.051°, 0.063°, and 0.049°, respectively while Comparative Examples 2 and 3 have Δ angles of 0.111° and 0.224° respectively.

A principle for improving film hardness of the photoalignment layer and minimizing deterioration of afterimage when the capping terminal is connected to the main chain end will now be described with reference to FIGS. 5 and 7.

Figure 5:
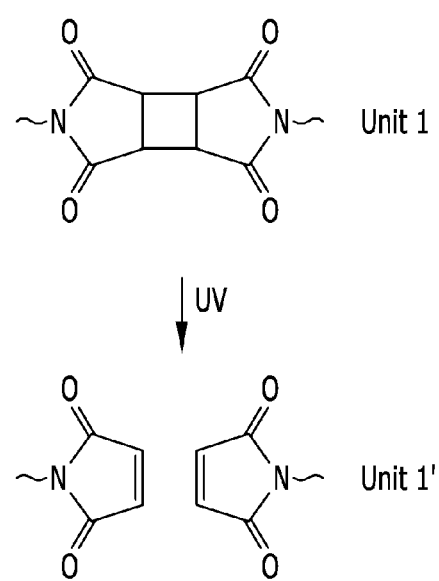
FIG. 5 illustrates a reaction of a polyimide that decomposes on a photoalignment layer according to an exemplary embodiment.
Figure 6:
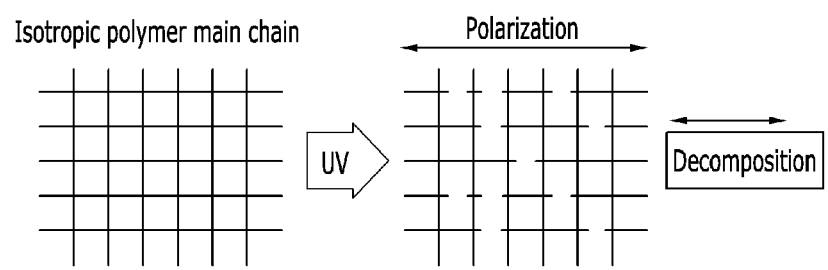
FIG. 6 illustrates a process of a photoalignment layer changing to anisotropy from isotropy according to an exemplary embodiment.

FIG. 5 illustrates a reaction of a polyimide that decomposes on a photoalignment layer according to an exemplary embodiment. FIG. 6 illustrates a process of a photoalignment layer changing to anisotropy from isotropy according to an exemplary embodiment.

Referring to FIG. 5, cyclobutane dianhydride (CBDA) and a diamine are copolymerized to form a polyamic acid. Then a polyimide (Unit 1) is formed through a baking process. The polyimide is subsequently irradiated with ultraviolet (UV) light to form maleimide (Unit 1').

FIG. 6 illustrates that a polymer main chain including the polyimide (Unit 1) shown in FIG. 5 is aligned by decomposing the polymer main chain with polarized UV irradiation. Referring to FIG. 6, when an isotropic polymer main chain is irradiated with polarized UV, photolysis occurs in a polarization direction (absorption axis direction) to align the photoalignment layer in a direction perpendicular to the polarization direction. When an exposure amount is too small, the photolysis rate is low so that alignment may be deteriorated. On the contrary, if the exposure amount is too large, the photolysis rate is high so that photolysis occurs not only in a polarization direction, but also in the other directions also deteriorating the alignment.

Figure 7:
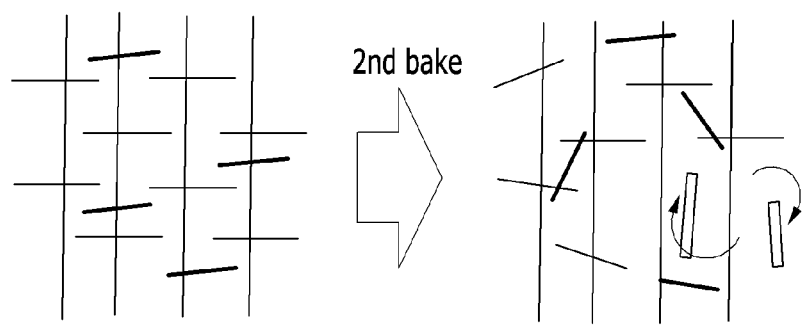
FIG. 7 illustrates for an embodiment method for improving the afterimage of a liquid crystal display by using a photoalignment layer including a flexible cross-linking agent.
Figure 7:
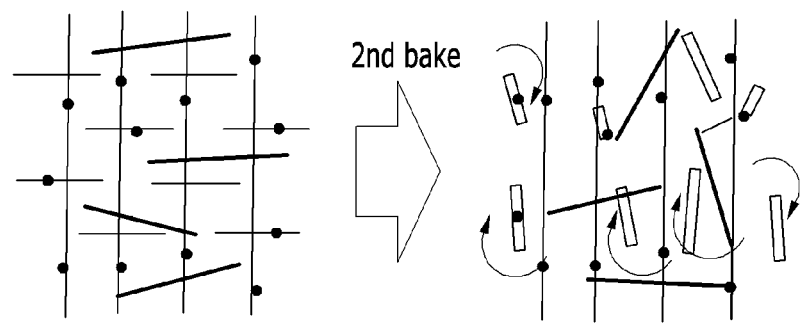

FIG. 7 illustrates an embodiment method for improving the afterimage of a liquid crystal display by using a photoalignment layer using a flexible cross-linking agent.

Referring to FIG. 7, when a second baking process proceeds on a photoalignment layer including a rigid crosslinking agent, the rigid crosslinking agent interrupts rearrangement of photolysis molecule, so that the rearrangement does not have a large improvement effect on the afterimage (i.e., a small rearrangement effect). However, when a second baking process proceeds on a photoalignment layer including a flexible capping terminal, rearrangement of photolysis molecules is not interrupted so that the rearrangement has a large improvement effect on the afterimage. The second baking process may be a process for baking the photoalignment layer once again in order to increase alignment. The photoalignment layer may acquire a uniform composition for crosslinking by connecting the flexible capping terminal to the main chain terminal of the photoalignment layer after the polymerization reaction during a process for synthesizing a polyamic acid or polyimide.

A liquid crystal display including a photoalignment layer according to an exemplary embodiment will now be described.

Figure 8:
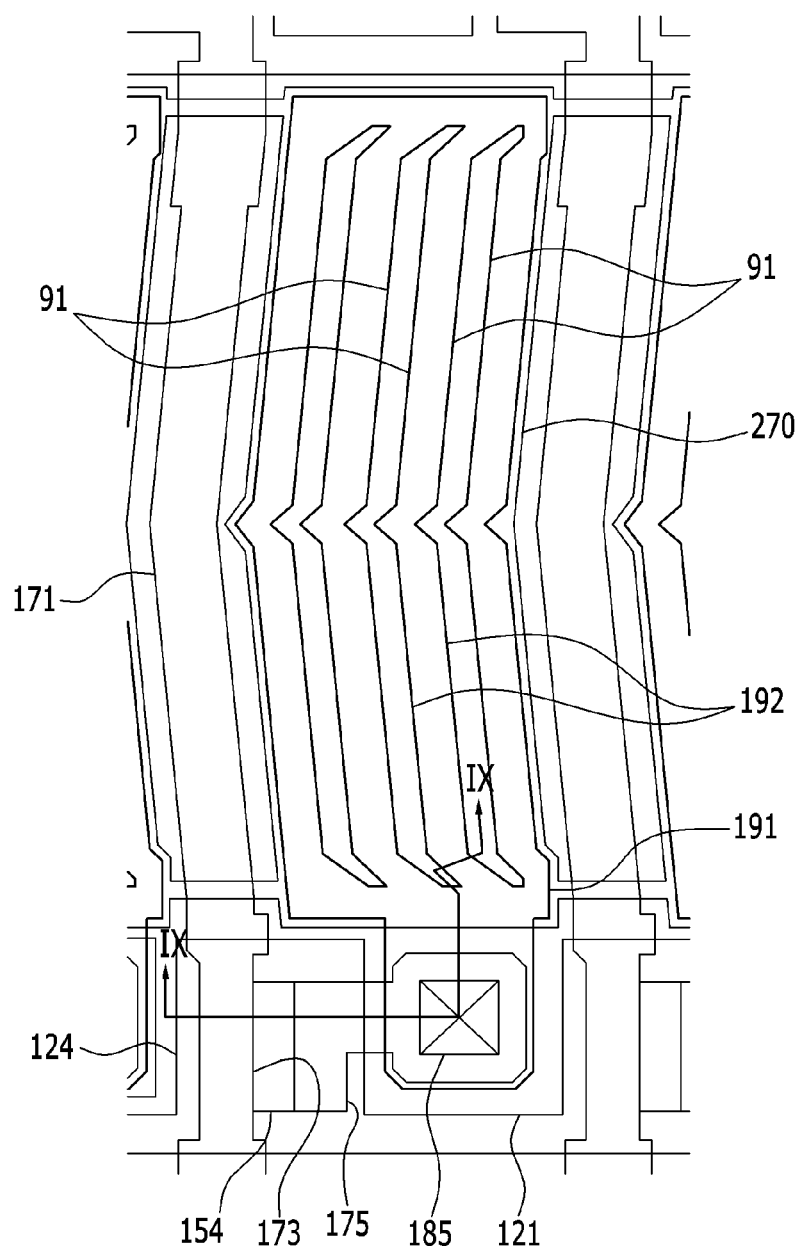
FIG. 8 illustrates a top plan view of a liquid crystal display according to an exemplary embodiment.
Figure 9:
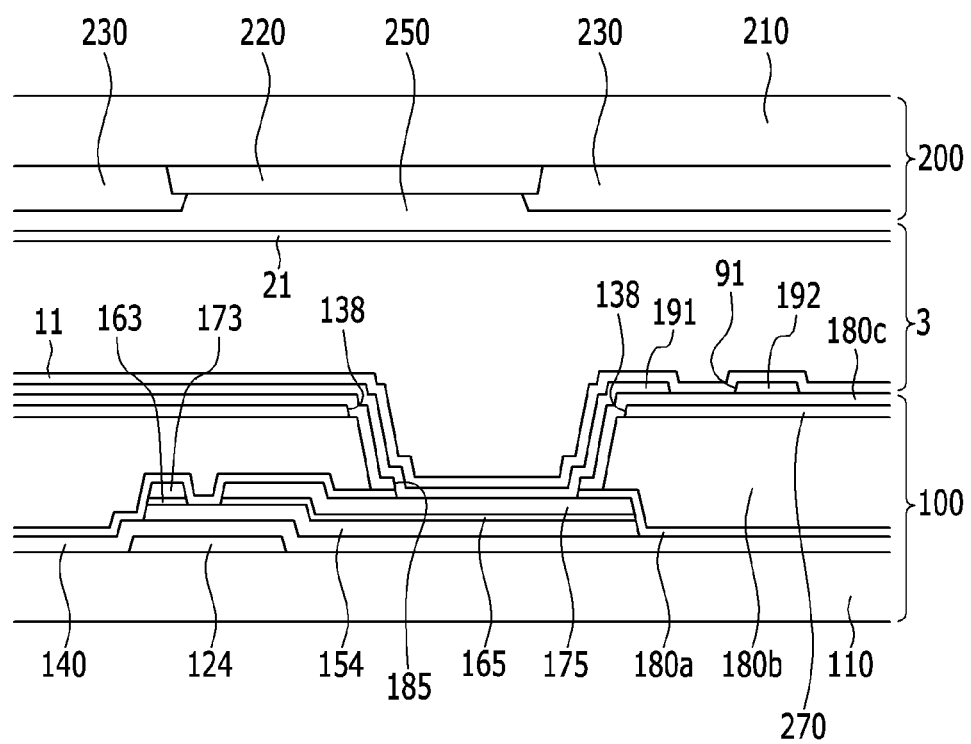
FIG. 9 shows a cross-sectional view with respect to line IX-IX of FIG. 8.

FIG. 8 illustrates a top plan view of a liquid crystal display according to an exemplary embodiment. FIG. 9 illustrates a cross-sectional view with respect to line IX-IX of FIG. 8.

Referring to FIGS. 8 and 9, the liquid crystal display includes a lower panel 100 and an upper panel 200 facing each other, and a liquid crystal layer 3 injected therebetween.

The lower panel 100 will now be described.

A gate conductor including a gate line 121 is formed on a first substrate 110 made of transparent glass or plastic.

The gate line 121 may include a gate electrode 124 and a wide end portion (not shown) for accessing another layer or an external driving circuit. The gate line 121 may include at least one of an aluminum (Al)-based metal such as aluminum or an aluminum alloy, a silver (Ag)-based metal such as silver or a silver alloy, a copper (Cu)-based metal such as copper or a copper alloy, a molybdenum (Mo)-based metal such as molybdenum or a molybdenum alloy, chromium (Cr), tantalum (Ta), and titanium (Ti). However, the gate line 121 may have a multilayer structure including at least two conductive layers with different physical properties.

A gate insulating layer 140 including at least one of a silicon nitride ($SiN_x$) and a silicon oxide ($SiO_x$) is formed on the gate line 121. The gate insulating layer 140 may have a multilayer structure including at least two insulating layers having different physical properties.

A semiconductor layer 154 is disposed on the gate insulating layer 140. The semiconductor layer 154 may include at least one of amorphous silicon and polysilicon. The semiconductor layer 154 may be formed of an oxide semiconductor.

Ohmic contacts 163 and 165 are formed on the semiconductor layer 154. The ohmic contacts 163 and 165 may include at least one of n+ hydrogenated amorphous silicon and silicide. If made of a material such as n+ hydrogenated amorphous silicon, an n-type impurity such as phosphorus or the like is doped in a high concentration. The ohmic contacts 163 and 165 may be paired to be disposed on a semiconductor layer 154. When the semiconductor layer 154 is an oxide semiconductor, the ohmic contacts 163 and 165 may be omitted.

A data line 171 including a source electrode 173 and a data conductor including a drain electrode 175 are formed on the ohmic contacts 163 and 165 and the gate insulating layer 140.

The data line 171 includes a wide end portion (not shown) for accessing another layer or an external driving circuit. The data line 171 transmits a data signal and extends in a perpendicular direction to cross the gate line 121.

The data line 171 may have a flexure portion having a curved shape in order to obtain maximum transmittance of a liquid crystal display. The flexure portions may meet in a middle region of a pixel area to form a V-shape.

A source electrode 173 is part of the data line 171 and is disposed on a same line as the data line 171. The drain electrode 175 is formed to extend in parallel with the source electrode 173. Therefore, the drain electrode 175 is parallel with part of the data line 171.

A gate electrode 124, a source electrode 173, and a drain electrode 175 form one thin film transistor (TFT) with a semiconductor layer 154. A channel of the thin film transistor is formed on the semiconductor layer 154 between the source electrode 173 and the drain electrode 175.

The liquid crystal display, according to an exemplary embodiment, includes a source electrode 173, disposed on the same line of the data line 171, and a drain electrode 175 stretched in parallel with the data line 171, thereby broadening the width of the thin film transistor without widening the area occupied by a data conductor. Thus, the liquid crystal display has an increased aperture ratio.

The data line 171 and the drain electrode 175 are preferably made of a refractory metal such as molybdenum, chromium, tantalum, and titanium, or an alloy thereof, and may have a multilayer structure including a refractory metal layer (not shown) and a low resistance conductive layer (not shown). Examples of the multilayer structure include a double layer of a chromium or molybdenum (alloy) lower layer and an aluminum (alloy) upper layer, and a triple layer of a molybdenum (alloy) lower layer, an aluminum (alloy) intermediate layer, and a molybdenum (alloy) upper layer.

A first passivation layer 180a is disposed on exposed portions of the data conductors 171, 173, and 175, the gate insulating layer 140, and the semiconductor 154. The first passivation layer 180a may be formed with an organic insulating material or an inorganic insulating material.

A second passivation layer 180b is formed on the first passivation layer 180a. The second passivation layer 180b may be formed with an organic insulator.

The second passivation layer 180b may be a color filter. When the second passivation layer 180b is a color filter, the layer 180b may inherently display one a primary color. Examples of a primary color include red, green, blue, yellow, cyan, and magenta, or the like. Though not shown, a color filter displaying a mixed of the primary colors, or white, in addition to the primary colors, may be further included as the color filter. When the second passivation layer 180b is a color filter, the color filter 230 (described below) may be omitted from an upper panel 200. In an alternate embodiment, the second passivation layer 180b may be formed of an organic insulating material, and a color filter (not shown) may be formed between the first passivation layer 180a and the second passivation layer 180b.

A common electrode 270 is disposed on the second passivation layer 180b. The common electrode 270, having a planar shape, may be formed on a front surface of a substrate 110 as one plate, and may have an opening 138 disposed in a region corresponding to the surrounding of the drain electrode 175. That is, the common electrode 270 may have a plane shape in the form of a plate.

Common electrodes 270 disposed in adjacent pixels are connected to each other, may receive a certain level of common voltage conveyed from the outside of a display area.

An insulating layer 180c is disposed on the common electrode 270. The insulating layer 180c may be formed of an organic insulating material or an inorganic insulating material.

A pixel electrode 191 is disposed on the insulating layer 180c. The pixel electrode 191 includes a curved edge almost in parallel with the flexure portion of a data line 171. The pixel electrode 191 has a plurality of cutouts 91 and includes a plurality of branch electrodes 192 disposed between neighboring cutouts 91.

The pixel electrode 191 is a first field generating electrode, and the common electrode 270 is a second field generating electrode. The pixel electrode 191 and the common electrode 270 may form a fringe field.

A first contact hole 185 for exposing the drain electrode 175 is formed in the first passivation layer 180a, the second passivation layer 180b, and the insulating layer 180c. The pixel electrode 191 is physically and electrically connected to the drain electrode 175 through the contact hole 185. The pixel electrode 191 receives a voltage from the drain electrode 175.

A first alignment layer 11 is formed on the pixel electrode 191 and the insulating layer 180c The first alignment layer 11 includes a photoalignment layer.

In an exemplary embodiment, the first alignment layer 11 includes a photoalignment layer according to the above-described embodiments.

A method for forming an alignment layer will now be described.

The photoalignment agent is applied to the pixel electrode 191 and then baked. The baking process includes a pre-bake and a hard bake. During the hard baking process, the polyamic acid included in the photoalignment agent may convert into the polyimide.

Next, the photoalignment agent is irradiated by polarized beams to form a photolysed first alignment layer 11. The irradiated beams may be ultraviolet rays of 240 nanometers to 380 nanometers. Preferably, the irradiate beams are ultraviolet rays of 254 nanometers. The polarized beams may include energy of 0.20 $J/cm^2$ to 1.0 $J/cm^2$, and preferably 0.40 $J/cm^2$ to 0.50 $J/cm^2$.

In order to increase alignment of liquid crystal molecules, the photoalignment layer may be baked a second time. Herein, photolysed molecules may be rearranged to increase anisotropy.

The upper panel 200 will now be described.

A light blocking member 220 is formed on the second substrate 210 made of transparent glass or plastic. The light blocking member 220, also called a black matrix, prevents light leakage.

A plurality of color filters 230 are formed on the second substrate 210. When the second passivation layer 180b of the lower panel 100 is a color filter, or a color filter is formed on the lower panel 100, the color filter 230 of the upper panel 200 may be omitted. The light blocking member 220 of the upper panel 200 may be formed on the lower panel 100.

An overcoat 250 is formed on the color filter 230 and the light blocking member 220. The overcoat 250 may be made of an insulating material (e.g., an organic insulating material). The overcoat 250 prevents the color filter 230 from being exposed and provides a flat surface. However, the overcoat 250 may be omitted.

A second alignment layer 21 is formed on the overcoat 250. The second alignment layer 21 may be formed with a material that is substantially the same as the material use for the first alignment layer 11. In addition, the second alignment layer 21 may be formed using the same method as the first alignment layer 11.

The liquid crystal layer 3 may include liquid crystal molecules with negative dielectric anisotropy or positive dielectric anisotropy.

A direction of long axes of the liquid crystal molecules of the liquid crystal layer 3 may be arranged in parallel with the display panels 100 and 200.

The pixel electrode 191 receives a data voltage from the drain electrode 175 while the common electrode 270 receives a predetermined common voltage from a common voltage applying unit disposed outside a displaying area.

The pixel electrode 191 and the common electrode 270, which are field generating electrodes, generate an electric field so that the liquid crystal molecules of the liquid crystal layer 3 disposed on the two field generating electrodes 191 and 270 may rotate in a direction perpendicular or parallel to the electric field. Depending on the rotation direction of the liquid crystal molecules as determined above, the polarization of light passing through the liquid crystal layer is changed.

As such, by forming two field generating electrodes 191 and 270 on one display panel 100, the transmittance of a liquid crystal display is raised, and a wide viewing angle may be realized.

The liquid crystal display according to an exemplary embodiment includes the common electrode 270 with a planar shape and the pixel electrode 191 with a plurality of branch electrodes. However, in an alternate embodiment, a liquid crystal display may include the pixel electrode 191 having a planar shape and the common electrode 270 having a plurality of branch electrodes.

The embodiments described herein may apply to all cases where two field generating electrodes are overlapped with an insulating layer interposed therebetween on a first substrate 110 where a first field generating electrode is formed under the insulating layer having a planar shape and a second field generating electrode formed on the insulating layer having a plurality of branch electrodes.

According to the exemplary embodiment of the present invention, the photoalignment layer is formed by using the diamine including a flexible group and the stereo reaction group in a dendrimer shape crosslink-reacting with the alignment layer main chain terminal, thereby realizing the photoalignment layer with optimized afterimage and film hardness and the liquid crystal display.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A photoalignment layer, comprising:
a polyimide; and
a capping terminal connected to a main chain terminal of the polyimide,
wherein the capping terminal is a stereo compound expressed as $(Z-SiO_{3/2})_n$, wherein n is an even number that is greater than 6, and a Z group of the stereo compound comprises at least one of a first compound expressed in Chemical Formula 1 and a second compound expressed in Chemical Formula 2:

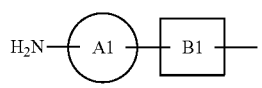

(Chemical Formula 1)

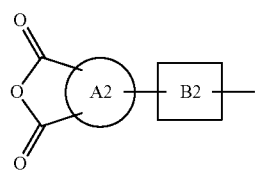

(Chemical Formula 2)

wherein A1 and A2 are, independently, a C4 to C20 aromatic compound or a C4 to C20 aliphatic cyclic compound, and B1 and B2 are, independently, a flexible group comprising the alkylene group, $-C_mH_{2m}-$, wherein m is a natural number from 2 to 21.

2. The photoalignment layer of claim 1, wherein:
the flexible group of the second compound comprises a third compound expressed in Chemical Formula 3:

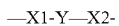 (Chemical Formula 3), and wherein X1 and X2 are, independently, a single bond, $-O-$, $-S-$, $-COO-$, $-NHCO-$, $-NH-$, $-CH_2CH_2O-$, $-OCH_2CH_2-$, a C6 to C30 aromatic compound, or a C4 to C20 aliphatic cyclic compound and Y is a single bond, $-(CH_2)_{a1}-$, wherein a1 is a natural number of 2 to 10, $-(CH_2OCH_2)_{a2}-$, wherein a2 is a natural number of 1 to 3, $-(CH_2CH_2OCH_2CH_2)_{a3}-$, wherein a3 is 1 or 2, or $-(OSi(OR)_2)_{a4}-$, wherein R is $C_nH_{2n+1}$, n is a natural number of 1 to 10, and a4 is a natural number of 2 to 8.

3. The photoalignment layer of claim 2, wherein:
the polyimide comprises a repeating unit of a fifth compound expressed in Chemical Formula 5:

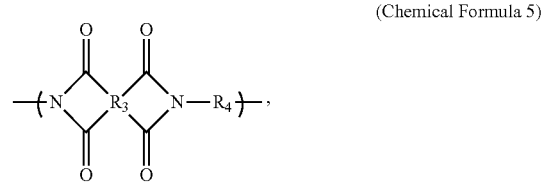

(Chemical Formula 5)

and
wherein R3 is a tetravalent organic group derived from an aliphatic cyclic acid dianhydride or an aromatic acid dianhydride and R4 is a divalent organic group derived from an aromatic diamine.

4. The photoalignment layer of claim 3, wherein:
the Z group of the capping terminal connected to a main chain terminal of the polyimide is expressed in Structural Formula 2:

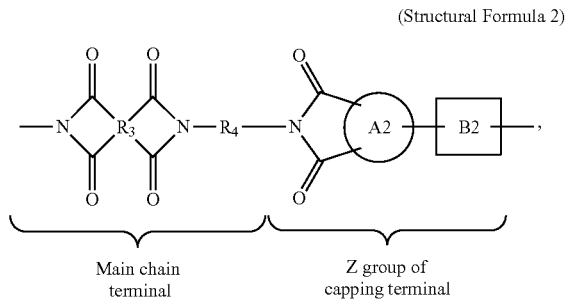

(Structural Formula 2)

and
wherein R3 is a tetravalent organic group derived from an aliphatic cyclic acid dianhydride or an aromatic acid dianhydride, R4 is a divalent organic group derived from an aromatic diamine, A2 is a C4 to C20 aromatic compound or a C4 to C20 aliphatic cyclic compound, and B2 is a flexible group comprising the alkylene group.

5. The photoalignment layer of claim 3, wherein:
the polyimide is a copolymer of (a) at least one of cyclobutane dianhydride (CBDA) and a cyclobutane dianhydride (CBDA) derivative, and (b) a first diamine.

6. The photoalignment layer of claim 5, wherein:
the first diamine includes a sixth compound expressed in Chemical Formula 6:

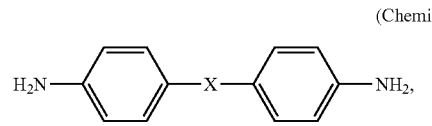

(Chemical Formula 6)

and
wherein X is $-(CH_2)_h-$, $-S-(CH_2)_h-S-$, $-O-(CH_2)_h-O-$,

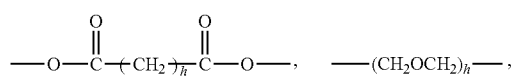
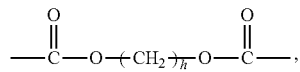
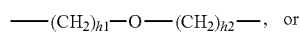
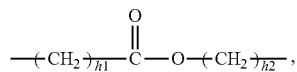

wherein h is a natural number of 1 to 10, and h1 and h2 are a combination of natural numbers selected so that the sum of the number of carbons of an alkylene group of X is 2 to 10.

7. The photoalignment layer of claim 6, wherein:
the copolymer further comprises a polymer of (a) at least one of cyclobutane dianhydride (CBDA) and a cyclobutane dianhydride (CBDA) derivative, and (b) a second diamine expressed in Chemical Formula 7:

(Chemical Formula 7)

8. The photoalignment layer of claim 7, wherein:
the copolymer comprises at least one of repeating units expressed in Chemical Formula 9 and repeating units express in Chemical Formula 10:

(Chemical Formula 9)

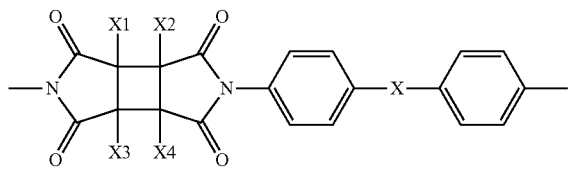

(Chemical Formula 10)

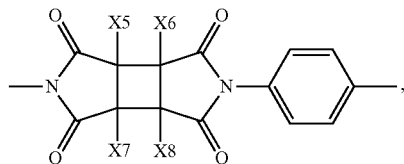

and
wherein X is $-(CH_2)_h-$, $-S-(CH_2)_h-S-$, $-O-(CH_2)_h-O-$,

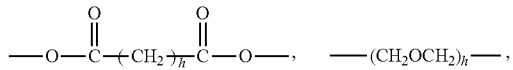
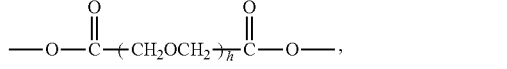
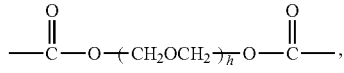
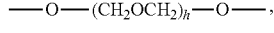
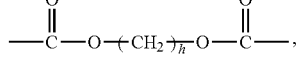
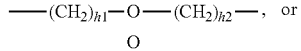
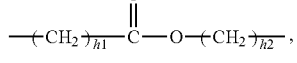

h is a natural number of 1 to 10, h1 and h2 are natural numbers selected so that the sum of the number of carbons of an alkylene group of X is 2 to 10, X1 to X8 are hydrogen, a halogen, a substituted or unsubstituted alkyl group, a substituted or unsubstituted aryl group, and a substituted or unsubstituted heteroaryl group.

9. The photoalignment layer of claim 7, wherein:
the copolymer comprises a compound expressed in Chemical Formula 11:

(Chemical Formula 11)

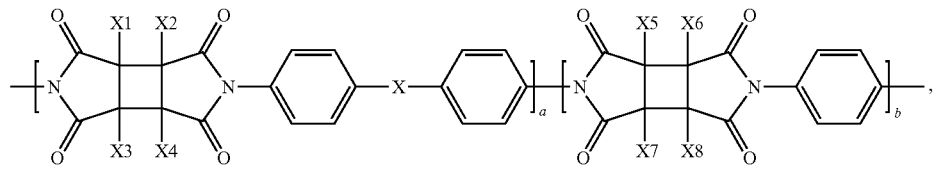

and
wherein X is $-(CH_2)_h-$, $-S-(CH_2)_h-S-$, $-O-(CH_2)_h-O-$,

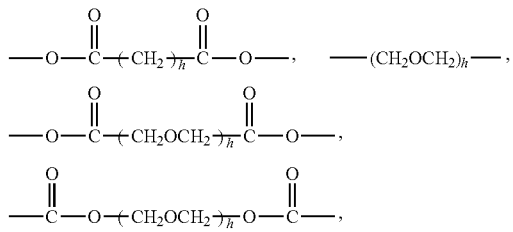

-continued

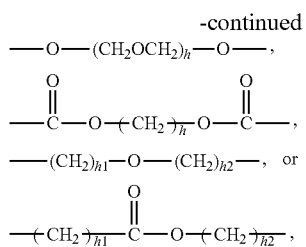

wherein h is a natural number of 1 to 10, h1 and h2 are natural numbers selected so that the sum of the number of carbons of an alkylene group of X is 2 to 10, a:b is 1:99 to 99:1, and X1 to X8 are, independently, hydrogen, a halogen, a substituted or unsubstituted alkyl group, a substituted or unsubstituted aryl group, and a substituted or unsubstituted heteroaryl group.

10. A liquid crystal display, comprising:
a first substrate;
a thin film transistor disposed on the first substrate;
a first electrode connected to the thin film transistor; and
a first alignment layer disposed on the first electrode,
wherein the first alignment layer comprises a polyimide and a capping terminal connected to a main chain terminal of the polyimide, and
wherein the capping terminal is a stereo compound expressed as $(Z-SiO_{3/2})_n$, wherein n is an even number that is greater than 6, and a Z group of the stereo compound comprises at least one of a first compound expressed in Chemical Formula 1 and a second compound expressed in Chemical Formula 2:

(Chemical Formula 1)

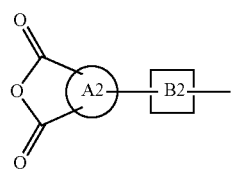
(Chemical Formula 2)

wherein A1 and A2 are, independently, a C4 to C20 aromatic compound or a C4 to C20 aliphatic cyclic compound, and B1 and B2 are, independently, a flexible group comprising the alkylene group, $-C_mH_{2m}-$, wherein m is a natural number from 2 to 21.

11. The liquid crystal display of claim 10, wherein:
the flexible group of at least one of the first compound and the second compound comprises a third compound expressed in Chemical Formula 3:

 (Chemical Formula 3), and wherein X1 and X2 are, independently, a single bond, $-O-$, $-S-$, $-COO-$, $-NHCO-$, $-NH-$, $-CH_2CH_2O-$, $-OCH_2CH_2-$, a C6 to C30 aromatic compound, or a C4 to C20 aliphatic cyclic compound, and Y is a single bond, $-(CH_2)_{a1}-$, wherein a1 is a natural number of 2 to 10, $-(CH_2OCH_2)_{a2}-$, wherein a2 is a natural number of 1 to 3, $-(CH_2CH_2OCH_2CH_2)_{a3}-$, wherein a3 is 1 or 2, or $-(OSi(OR)_2)_{a4}-$, R is $C_nH_{2n+1}$, wherein n is a natural number of 1 to 10, and a4 is a natural number of 2 to 8.

12. The liquid crystal display of claim 11, wherein:
the polyimide comprises a repeating unit of a fifth compound expressed in Chemical Formula 5:

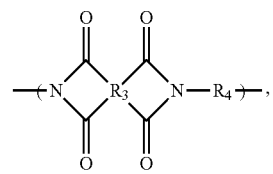
(Chemical Formula 5)

and
wherein R3 is a tetravalent organic group derived from an aliphatic cyclic acid dianhydride or an aromatic acid dianhydride, and R4 is a divalent organic group derived from an aromatic diamine.

13. The liquid crystal display of claim 12, wherein:
the Z group of the capping terminal connected to a main chain terminal of the polyimide is expressed in Structural Formula 2:

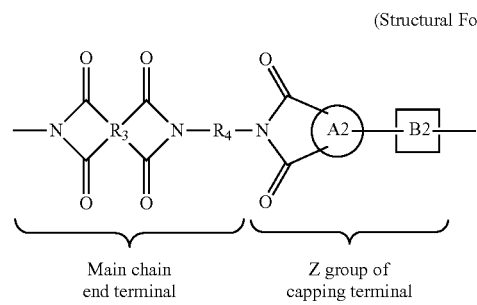
(Structural Formula 2)

Main chain end terminal    Z group of capping terminal and
wherein R3 is a tetravalent organic group derived from an aliphatic cyclic acid dianhydride or an aromatic acid dianhydride, R4 is a divalent organic group derived from aromatic diamine, A2 is a C4 to C20 aromatic compound or a C4 to C20 aliphatic cyclic compound, and B2 is a flexible group including] the alkylene group.

14. The liquid crystal display of claim 12, wherein:
the polyimide is a copolymer of (a) at least one of cyclobutane dianhydride (CBDA) and a cyclobutane dianhydride (CBDA) derivative, and (b) a first diamine.

15. The liquid crystal display of claim 14, wherein:
the first diamine comprises a compound expressed in Chemical Formula 6:

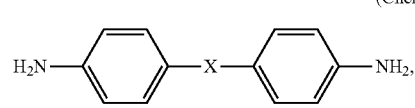
(Chemical Formula 6)

and
wherein X is $-(CH_2)_h-$, $-S-(CH_2)_h-S-$, $-O-(CH_2)_h-O-$,

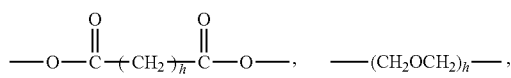

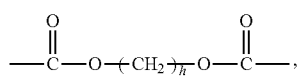

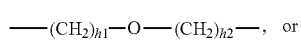

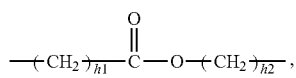

wherein h is a natural number of 1 to 10, and h1 and h2 are natural numbers selected so that the sum of number of carbons an alkylene group of X is 2 to 10.

16. The liquid crystal display of claim 15, wherein:
the copolymer further comprises a polymer of (a) at least one of cyclobutane dianhydride (CBDA) and a cyclobutane dianhydride (CBDA) derivative, and (b) a second diamine expressed in Chemical Formula 7:

(Chemical Formula 7)

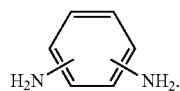

17. The liquid crystal display of claim 16, wherein:
the copolymer includes at least one of a repeating unit expressed in Chemical Formula 9 and a repeating unit expressed in Chemical Formula 10:

(Chemical Formula 9)

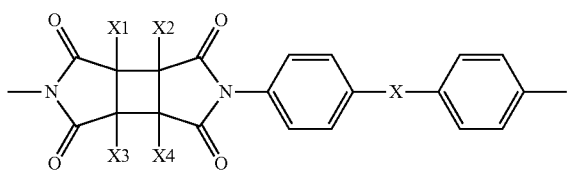

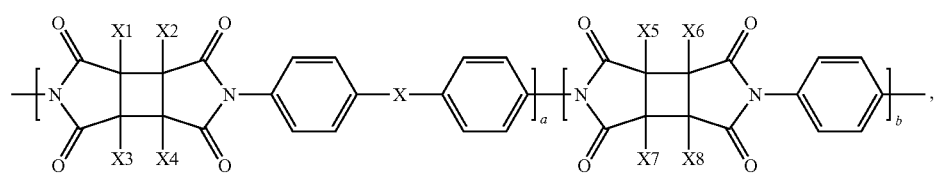

(Chemical Formula 10)

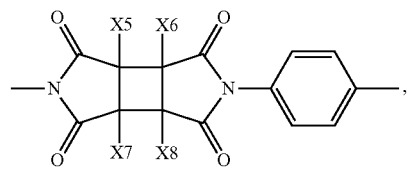

and
wherein X is

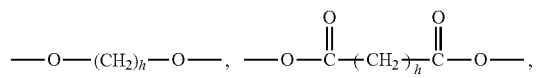

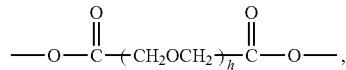

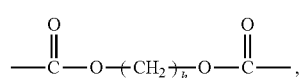

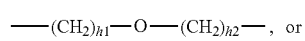

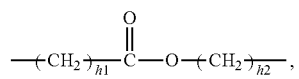

wherein h is a natural number of 1 to 10, h1 and h2 are natural numbers selected so that the sum of the number of carbons of an alkylene group of X is 2 to 10, X1 to X8 are, independently, hydrogen, a halogen, a substituted or unsubstituted alkyl group, a substituted or unsubstituted aryl group, and a substituted or unsubstituted heteroaryl group.

18. The liquid crystal display of claim 16, wherein:
the copolymer comprises a compound expressed in Chemical Formula 11:

(Chemical Formula 11)

and
wherein X is

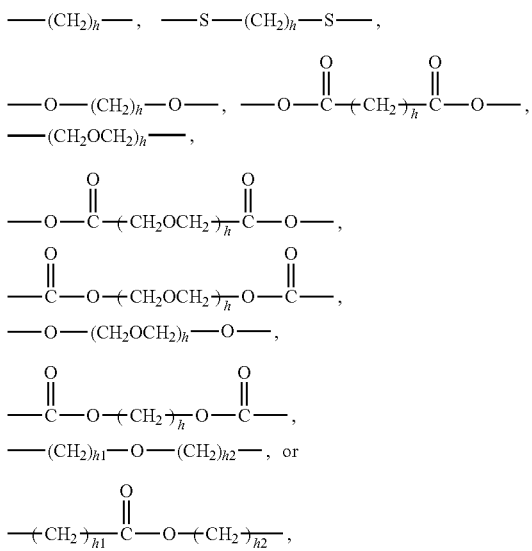

wherein h is a natural number of 1 to 10, h1 and h2 are natural numbers selected so that the sum of the number of carbons of an alkylene group of X is 2 to 10, a:b is 1:99 to 99:1, and X1 to X8 are hydrogen, a halogen, a substituted or unsubstituted alkyl group, a substituted or unsubstituted aryl group, and a substituted or unsubstituted heteroaryl group.

19. The liquid crystal display of claim 10, further comprising:
a second electrode disposed between the first substrate and an insulating layer.

20. The liquid crystal display of claim 19, wherein:
the first electrode comprises a plurality of branch electrodes, and
the second electrode comprises a planar shape.

21. The liquid crystal display of claim 20, wherein:
the branch electrodes overlap the second electrode.

22. The liquid crystal display of claim 21, further comprising:
a passivation layer disposed between the thin film transistor and the second electrode, wherein the thin film transistor is connected to the first electrode through a contact hole penetrating through the passivation layer and the insulating layer.

23. The liquid crystal display of claim 22, further comprising:
a second substrate facing the first substrate;
a second alignment layer disposed on the second substrate; and
a liquid crystal layer disposed between the first substrate and the second substrate, the liquid crystal layer comprising liquid crystal molecules,
wherein the second alignment layer is formed with a material that is substantially the same as the first alignment layer.

* * * * *